(12) United States Patent
Del Prete et al.

(10) Patent No.: US 8,345,445 B2
(45) Date of Patent: Jan. 1, 2013

(54) HEAT SINK ASSEMBLY FOR A PLUGGABLE MODULE

(75) Inventors: Stephen D Del Prete, Rehoboth, MA (US); Robert Stratton, Norton, MA (US); David A. Dedonato, Hopedale, MA (US)

(73) Assignee: Tyco Electronics Corporation, Berwyn, PA (US)

( * ) Notice: Subject to any disclaimer, the term of this patent is extended or adjusted under 35 U.S.C. 154(b) by 225 days.

(21) Appl. No.: 12/952,463

(22) Filed: Nov. 23, 2010

(65) Prior Publication Data

US 2012/0127665 A1    May 24, 2012

(51) Int. Cl.
*H05K 7/20* (2006.01)
*F28F 7/00* (2006.01)
*H01L 23/34* (2006.01)

(52) U.S. Cl. ....... 361/804; 165/80.2; 165/185; 257/719; 361/708; 361/715; 361/719

(58) Field of Classification Search ........................ None
See application file for complete search history.

(56) References Cited

U.S. PATENT DOCUMENTS

| | | | |
|---|---|---|---|
| 6,935,420 B1 | 8/2005 | Dong et al. | |
| 6,980,437 B2 * | 12/2005 | Bright | 361/704 |
| 7,319,592 B2 | 1/2008 | Wang et al. | |
| 7,554,807 B2 | 6/2009 | Wu et al. | |
| 7,974,098 B2 * | 7/2011 | Oki et al. | 361/715 |
| 8,081,470 B2 * | 12/2011 | Oki et al. | 361/715 |
| 2003/0161108 A1 * | 8/2003 | Bright et al. | 361/707 |
| 2005/0195565 A1 * | 9/2005 | Bright | 361/688 |
| 2006/0091529 A1 * | 5/2006 | Wehrly et al. | 257/706 |
| 2010/0067196 A1 * | 3/2010 | Costello et al. | 361/704 |
| 2012/0151950 A1 * | 6/2012 | Jagusztyn | 62/228.1 |

* cited by examiner

*Primary Examiner* — Gregory Thompson

(57) ABSTRACT

A heat sink assembly is provided for a pluggable module. The heat sink assembly includes a heat sink having a module side and an end surface that intersects the module side. The module side is configured to thermally communicate with the pluggable module. A holder extends from the end surface of the heat sink. A thermal interface material (TIM) layer extends on the module side of the heat sink. The TIM layer is configured to engage the pluggable module. The TIM layer includes an end that is engaged between the end surface and the holder of the heat sink.

20 Claims, 8 Drawing Sheets

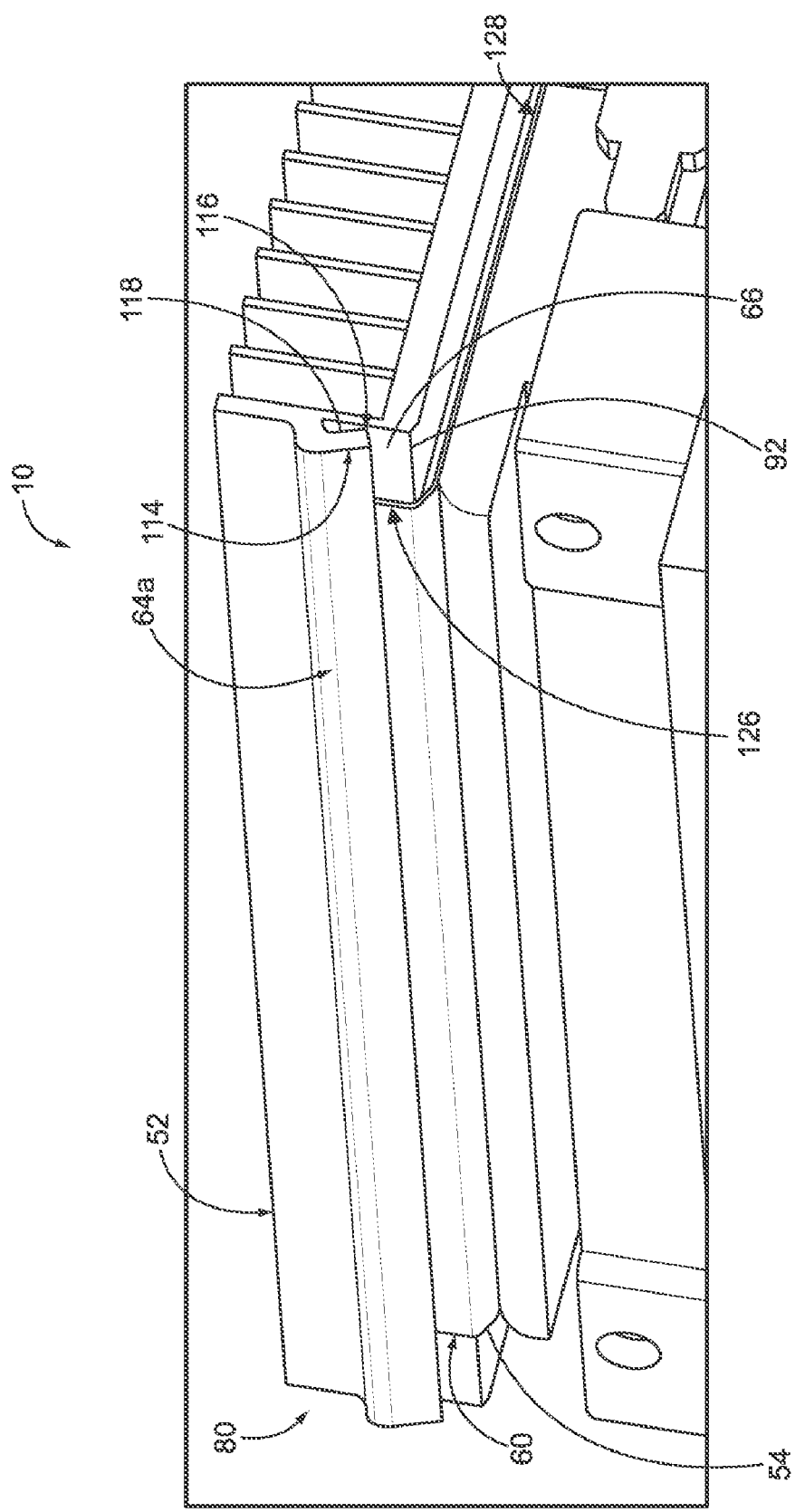

HEAT SINK ASSEMBLY FOR A PLUGGABLE MODULE

BACKGROUND OF THE INVENTION

The subject matter described and/or illustrated herein relates generally to pluggable modules, and more particularly, to heat sink assemblies for pluggable modules.

Various types of fiber-optic and copper based pluggable modules (sometimes referred to as "transceivers") are known. The pluggable modules permit communication between host equipment and external devices. The pluggable modules are plugged into a receptacle assembly that is mounted on a substrate, for example a printed circuit, within the host equipment. The receptacle assembly typically includes a receptacle defined between opposed guide rails that are mounted on the substrate. The pluggable module is loaded through a front end of the receptacle and mates with an interface connector positioned at a rear end of the receptacle. As the pluggable module is loaded into the receptacle, the guide rails guide the pluggable module within the receptacle to align the pluggable module with the interface connector.

Due to increases in the density, power output levels, and/or switching speeds of some pluggable modules, there may be a corresponding increase in heat generated by the pluggable module. The heat generated by the operation of the pluggable modules can lead to significant problems. For example, some pluggable modules may lose performance, or outright fail, if the core temperature of the module rises too high. Known techniques used to control the temperature of pluggable modules include mounting heat sink assemblies on the receptacle assembly. Some known heat sink assemblies include a thermal interface material that is attached to the heat sink at an interface between the heat sink and the pluggable module. When the pluggable module is received within the receptacle, the thermal interface material engages the module to thermally connect the module to the heat sink. But, difficulties may arise when the pluggable module slides along the thermal interface material as the module is loaded into the receptacle assembly. Specifically, contact between the thermal interface material and the pluggable module may damage the thermal interface material as the pluggable module slides therealong. For example, the pluggable module may tear and/or pull the thermal interface material away from the heat sink. An exposed end of the thermal interface material may be particularly susceptible to being snagged on the pluggable module as the module is loaded into the receptacle. Damage to the thermal interface material may cause the thermal interface material to lose performance or fail. Moreover, damage to the thermal interface material may make it more difficult to load the pluggable module into, and/or remove the module from, the receptacle.

BRIEF DESCRIPTION OF THE INVENTION

In one embodiment, a heat sink assembly is provided for a pluggable module. The heat sink assembly includes a heat sink having a module side and an end surface that intersects the module side. The module side is configured to thermally communicate with the pluggable module. A holder extends from the end surface of the heat sink. A thermal interface material (TIM) layer extends on the module side of the heat sink. The TIM layer is configured to engage the pluggable module. The TIM layer includes an end that is engaged between the end surface and the holder of the heat sink.

In another embodiment, a receptacle assembly is provided for a pluggable module. The receptacle assembly includes guide rails that are spaced apart from each other to define a receptacle extending therebetween. The receptacle is configured to receive the pluggable module therein. The receptacle assembly includes a heat sink assembly, which includes a heat sink having a module side and an end surface that intersects the module side. The module side defines a boundary of the receptacle and is configured to thermally communicate with the pluggable module when the pluggable module is received within the receptacle. A holder extends from the end surface of the heat sink. A thermal interface material (TIM) layer extends on the module side of the heat sink. The TIM layer is configured to engage the pluggable module when the pluggable module is received within the receptacle. The TIM layer includes an end that is engaged between the end surface and the holder of the heat sink.

In another embodiment, a heat sink assembly is provided for a pluggable module. The heat sink assembly includes a heat sink extending from a front end surface to a rear end surface. The heat sink includes a module side that intersects the front end surface at front edge and intersects the rear end surface at a rear edge. The module side is configured to thermally communicate with the pluggable module. A thermal interface material (TIM) layer extends on the module side of the heat sink. The TIM layer is configured to engage the pluggable module. The TIM layer extends from a front end to a rear end. The front end of the TIM layer overlaps the front edge of the heat sink and is attached to the front end surface of the heat sink. The rear end of the TIM layer overlaps the rear edge of the heat sink and is attached to the rear end surface of the heat sink.

BRIEF DESCRIPTION OF THE DRAWINGS

FIG. 8 is an enlarged perspective view of another portion of the connector assembly shown in FIGS. 1 and 6 illustrating attachment of the TIM layer shown in FIG. 5 to a rear end of the heat sink shown in FIGS. 3 and 4.

DETAILED DESCRIPTION OF THE INVENTION

Figure 1:
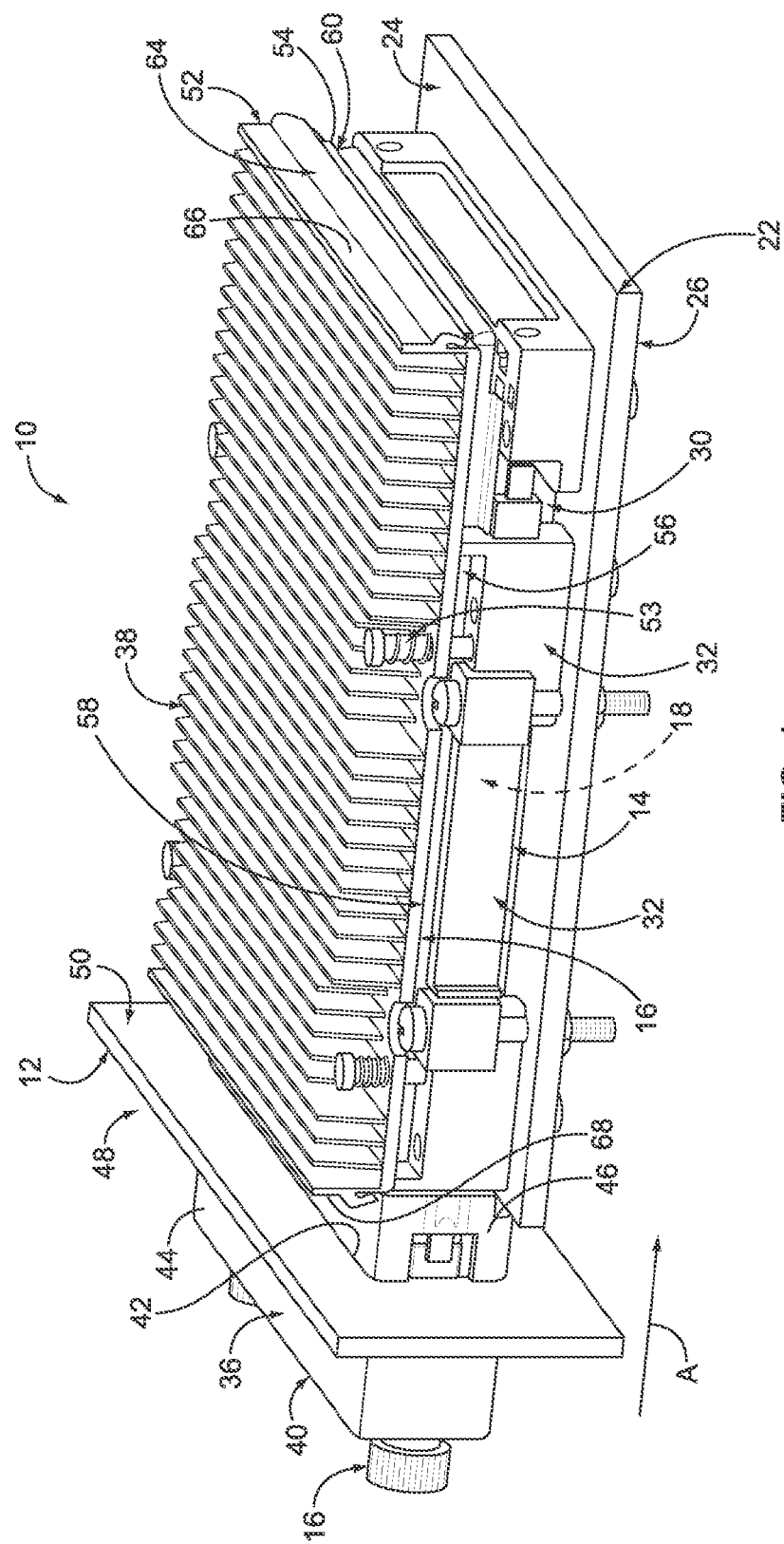
FIG. 1 is a perspective view of an exemplary embodiment of a connector assembly and an exemplary panel.

FIG. 1 is a perspective view of an exemplary embodiment of a connector assembly 10 and an exemplary panel 12. The connector assembly 10 includes a receptacle assembly 14 and a pluggable module 16. The receptacle assembly 14 includes a receptacle 18 that receives the pluggable module 16 therein. In the exemplary embodiment, the connector assembly 10 constitutes an input/output assembly for a device such as, but not limited to, a computer, a network switch, and/or the like.

The pluggable module 16 may represent a line card, a transceiver module, and/or the like that is pluggable into the receptacle assembly 14, but is not limited thereto. The pluggable module 16 includes one or more ports 20 (FIG. 2) for interfacing with data cables, such as, but not limited to, communication cables and/or the like. Optionally, the data cables may be copper wire data cables or fiber-optic data cables. The connector assembly 10 illustrated in FIG. 1 shows a single receptacle assembly 14 having a single pluggable module 16 received therein. But, the connector assembly 10 may include any number of receptacle assemblies 14 for receiving any number of pluggable modules 16 therein.

The connector assembly 10 includes a substrate 22, which is optionally a printed circuit. The substrate 22 includes a side 24 and a side 26 that is opposite the side 24. In the exemplary embodiment, only the side 24 includes a receptacle assembly 14 mounted thereon. In addition or alternatively, the side 26 may include a receptacle assembly 14 mounted thereon. In the exemplary embodiment, the side 24 of the substrate 22 defines a bottom boundary of the receptacle 18 of the receptacle assembly 14. Alternatively, another component may extend along the substrate 22 and define the bottom boundary of the receptacle 18. For example, a frame (not shown) or housing (not shown) may be supported by the substrate 22 and define the bottom boundary of the receptacle 18.

The connector assembly 10 includes an interface connector 30. The interface connector 30 may be mounted directly on the substrate 22, or alternatively may be indirectly supported by or positioned proximate to the substrate 22. In the exemplary embodiment, the interface connector 30 is mechanically and electrically connected to the substrate 22. Optionally, the interface connector 30 is positioned along and/or defines a rear of the receptacle 18 of the receptacle assembly 14. The interface connector 30 mates with the pluggable module 16 when the pluggable module 16 is loaded into the receptacle 18.

The receptacle assembly 14 includes guide rails 32, an optional bracket 36, and a heat sink assembly 38. In the exemplary embodiment, the guide rails 32 are mounted directly to the substrate 22. Alternatively, one or more of the guide rails 32 may be indirectly supported by or positioned proximate to the substrate 22. Although only one is visible in FIG. 1, the receptacle assembly 14 includes two opposing guide rails 32 that are spaced apart to define the receptacle 18 therebetween. Accordingly, the guide rails 32 define opposing sides of the receptacle 18. The guide rails 32 guide the pluggable module 16 into the receptacle 18. For example, the pluggable module 16 engages the guide rails 32 when the pluggable module 16 is loaded into the receptacle 18.

The guide rails 32 guide the pluggable module 16 to the interface connector 30 in a loading direction shown generally by the arrow A.

Optionally, a port end 40 of the pluggable module 16 extends through an opening 42 that extends through the panel 12. The pluggable module 16 may be loaded into the receptacle 18 through the opening 42. Alternatively, the pluggable module 16 is loaded into the receptacle 18 before the port end 40 of the pluggable module 16 is received through the panel opening 42, such that the pluggable module 16 is received through the opening 42 of the panel 12 after being loaded into the receptacle 18.

In the exemplary embodiment, the bracket 36 is mounted on the panel 12 at the opening 42. The bracket 36 may facilitate containing electromagnetic interference (EMI). The bracket 36 includes a shroud 44 and a backing plate 46. The shroud 44 engages a side 48 of the panel 12, while the backing plate 46 engages an opposite side 50 of the panel 12. The shroud 44 and the backing plate 46 mechanically connect together to hold the panel 12 therebetween. The pluggable module 16 extends through the backing plate 46 and the panel opening 42. The port end 40 of the pluggable module 16 extends through the shroud 44 such that the shroud 44 extends around the port end 40 of the pluggable module 16.

The heat sink assembly 38 includes a heat sink 52 and a thermal interface material (TIM) layer 54. The heat sink 52 is optionally mounted on the guide rails 32, for example using threaded fasteners 53 that threadably engage the guide rails 32 and/or the substrate 22. In addition or alternative to the threaded fasteners 53, the heat sink 52 may be mounted on the guide rails 32 and/or any other component of the assembly 10 using any other structure, means, fasteners, and/or the like, such as, but not limited to, using a clip, a non-threaded fastener, an interference fit, a snap-fit, a latch, and/or the like.

The heat sink 52 includes a module side 56 that defines an upper boundary of the receptacle 18. The module side 56 faces the pluggable module 16 when the pluggable module 16 is received within the receptacle 18. The TIM layer 54 extends on the module side 56 of the heat sink 52. When the pluggable module 16 is received within the receptacle 18, the TIM layer 54 engages an upper side 58 of the pluggable module 16. Engagement between the TIM layer 54 and the pluggable module 16 thermally communicates the module side 56 of the heat sink 52 with the upper side 58 of the pluggable module 16. Heat generated by the pluggable module 16 is thereby dissipated by the heat sink 52. The TIM layer 54 may increase the thermal transfer efficiency between the pluggable module 16 and the heat sink 52. As will be described below, the TIM layer 54 is held on the module side 56 of the heat sink 52 via engagement of ends 60 and 62 (FIGS. 5-7) of the TIM layer 54 with holders 64 positioned on respective end surfaces 66 and 68 of the heat sink 52.

Figure 2:
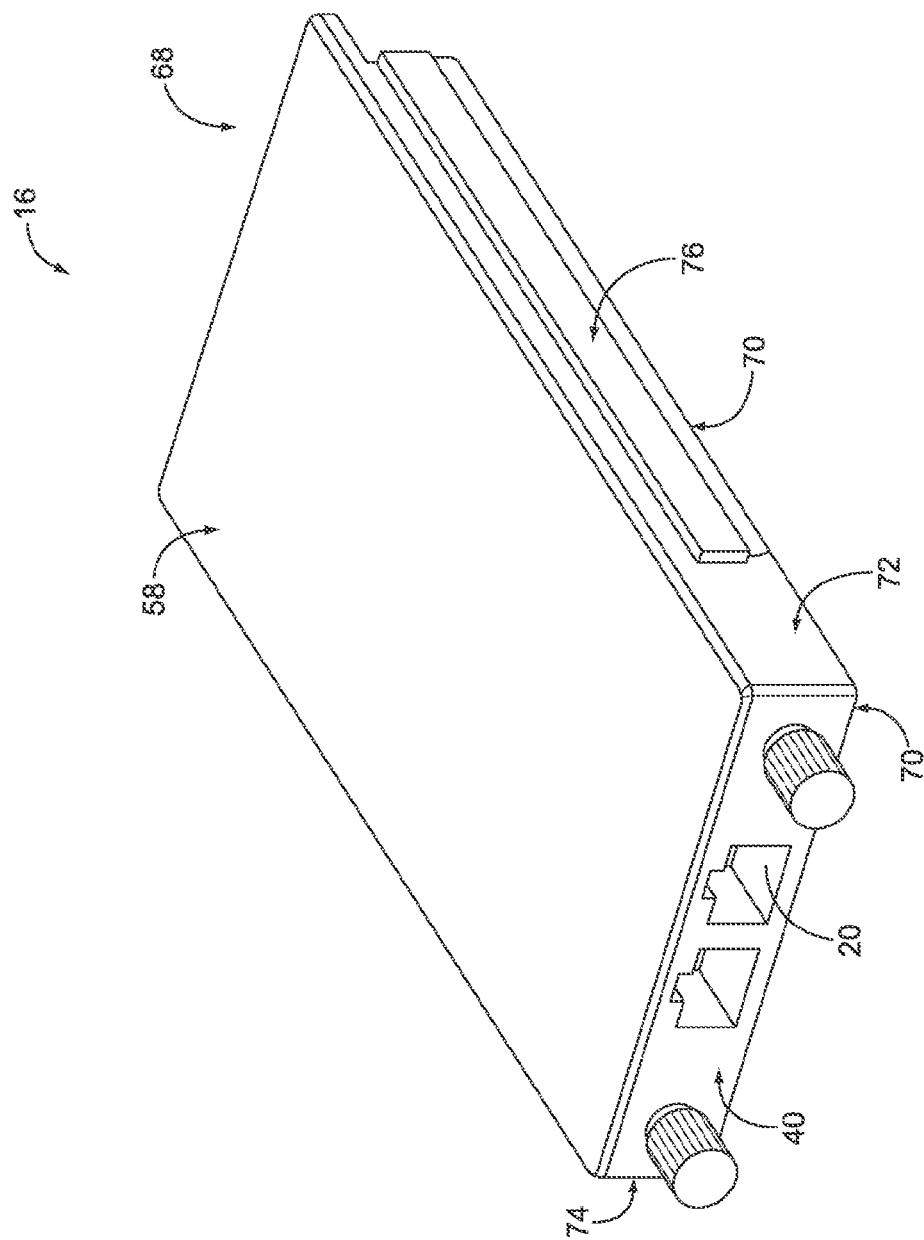
FIG. 2 is a perspective view of an exemplary embodiment of a pluggable module of the connector assembly shown in FIG. 1.

FIG. 2 is a perspective view of an exemplary embodiment of a pluggable module 16. The pluggable module 16 extends a length from the port end 40 to a mating end 68 that is opposite the port end 40. The pluggable module 16 is configured to be mated with the interface connector 30 (FIG. 1) at the mating end 68. The port end 40 includes the ports 20 that receive mating plugs (not shown). The mating plugs communicate with the interface connector 30 via the pluggable module 16. The pluggable module 16 includes the upper side 58 and a lower side 70. When the pluggable module 16 is loaded into the receptacle assembly 14 (FIG. 1), the lower side 70 faces the substrate 22 (FIG. 1) and the upper side 58 faces the module side 56 (FIGS. 1, 3, 4, and 6) of the heat sink 52 (FIGS. 1, 3, 4, and 6-8). Sides 72 and 74 extend between, and interconnect, the sides 58 and 70. In the exemplary embodiment, the pluggable module 16 has a generally box-shaped body, however the pluggable module 16 may additionally or alternatively include any other shape for being received within any shaped receptacle 18 (FIG. 1).

The pluggable module 16 includes one or more guide members 76. Each of the sides 72 and 74 includes a guide member 76 in the exemplary embodiment, although only the guide member 76 of the side 72 is visible in FIG. 2. Alternatively, only one of the sides 72 or 74 includes a guide member 76. In the exemplary embodiment, the guide members 76 are extensions that extend outwardly at the sides 72 and 74. The guide members 76 interact with the guide rails 32 (FIG. 1) for guiding the pluggable module 16 within the receptacle 18 of the receptacle assembly 14.

Figure 3:
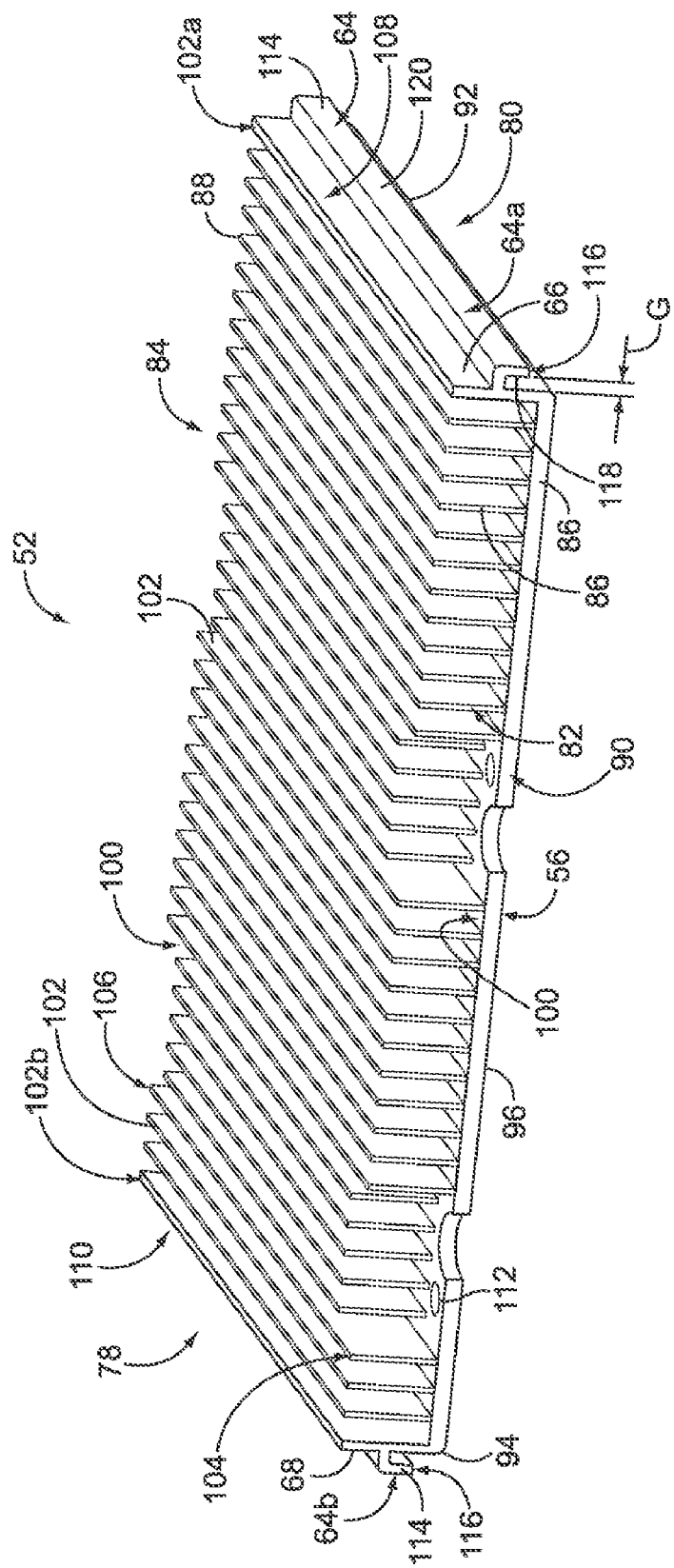
FIG. 3 is a perspective view of an exemplary embodiment of a heat sink of the connector assembly shown in FIG. 1.
Figure 4:
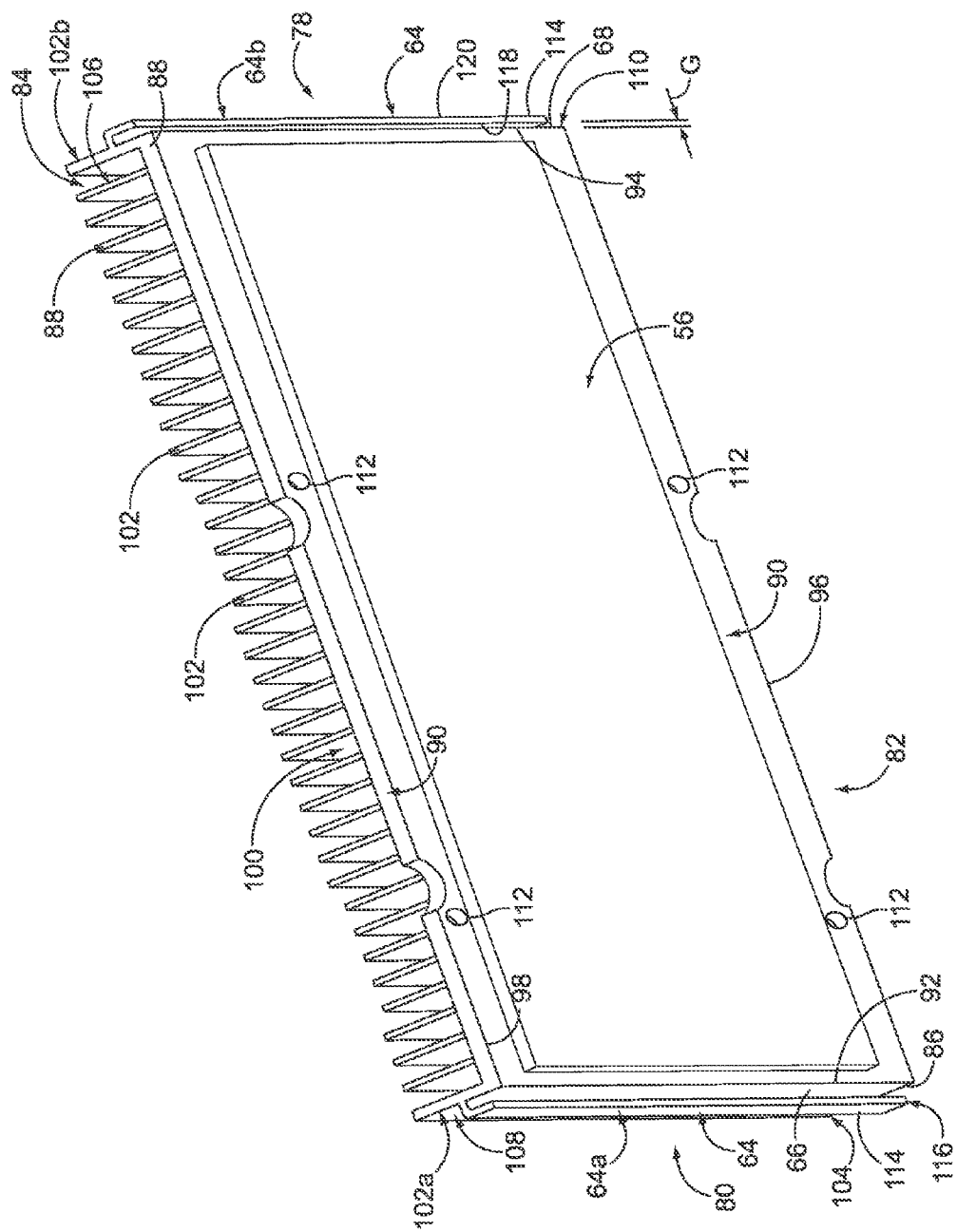
FIG. 4 is another perspective view of the heat sink shown in FIG. 3 taken from a different angle than FIG. 3.

FIG. 3 is a perspective view of the heat sink 52. FIG. 4 is another perspective view of the heat sink 52 taken from a different angle than FIG. 3. The heat sink 52 extends a length from a front end 78 to a rear end 80 that is opposite the front end 78. The front end 78 includes the end surface 68, while the rear end 80 includes the end surface 66. The heat sink 52 extends a width from a side end 82 to an opposite side end 84. The side end 82 includes an end surface 86. The side end 84 includes an end surface 88.

The heat sink 52 includes a base 90 that extends from the front end 78 to the rear end 80, and from the side end 82 to the side end 84. The base 90 defines the module side 56 of the heat sink 52. The module side 56 intersects the end surfaces 66, 68, 86, and 88 at respective edges 92, 94, 96, and 98. The base 90 defines a portion of each of the end surfaces 66, 68, 86, and 88. The base 90 includes a heat dissipation side 100 that is opposite the module side 56. One or more heat dissipating elements 102 extend outwardly from the heat dissipation side 100 of the base 90. Ends 104 and 106 of some of the heat dissipation elements 102 define a portion of the end surfaces 86 and 88, respectively. A side 108 of one of the heat dissipation elements 102a defines a portion of the end surface 66, while a side 110 of another of the heat dissipation elements 102b defines a portion of the end surface 68. In the exemplary embodiment, the heat dissipating elements 102 are cooling fins. But, in addition or alternative to the cooling fins, the heat sink 52 may include any other type of heat dissipating element. Although thirty eight are shown, the heat sink 52 may include any number of the heat dissipating elements 102. The end surface 68 may be referred to herein as a "front end surface", while the end surface 66 may be referred to herein as a "rear end surface". The edge 92 may be referred to herein as a "rear edge", while the edge 94 may be referred to herein as a "front edge".

In the exemplary embodiment, the base 90 of the heat sink 52 includes one or more openings 112 extending therethrough for mounting the heat sink 52 on the guide rails 32 (FIG. 1). Specifically, each of the openings 112 receives a corresponding one of the threaded fasteners 53 (FIG. 1) therethrough. In addition or alternative to the openings 112, the heat sink 52 may include any other structure, means, and/or the like for mounting the heat sink 52 on the guide rails 32 and/or any other component of the connector assembly 10 (FIGS. 1 and 6-8). In the exemplary embodiment, the heat sink 52 includes four openings 112 for receiving four threaded fasteners 53. But, the heat sink 52 may include any number of openings 112 for receiving any number of threaded fasteners 53.

As described above, the heat sink 52 includes one or more holders 64 for holding the TIM layer 54 (FIGS. 1 and 5-8) on the module side 56 of the heat sink 52. Each holder 64 includes an arm 114 that extends from the corresponding end surface 66 or 68 of the heat sink 52. The arm 114 extends outwardly from the corresponding end surface 66 or 68 to a tip 116. The arm 114 includes an interior surface 118 and an opposite exterior surface 120. FIGS. 3 and 4 illustrate an open, or uncrimped, position of each of the arms 114. In the open position, a gap G is defined at the tip 116 between the interior surface 118 and the corresponding end surface 66 or 68. As will be described below, each arm 114 is configured to be crimped toward the corresponding end surface 66 or 68, to a crimped position to hold the corresponding end 60 or 62 of the TIM layer 54 therebetween.

In the exemplary embodiment, the holders 64 are located at corresponding ones of the front and rear ends 78 and 80, respectively. Specifically, the arm 114 of a holder 64a extends from the end surface 66 while the arm 114 of a holder 64b extends from the end surface 68. More specifically, the arms 114 extend from the side 108 or 110 of a corresponding one of the heat dissipating elements 102a or 102b. But, the holders 64 may each have any other location on the heat sink 54. For example, one or more of the arms 114 may extend from the portion of the corresponding end surface 66 or 68 that is defined by the base 90. Moreover, and for example, one or more of the arms 114 may extend outwardly at the side end 82 and/or 84. When an arm 114 extends outwardly at the side end 82 or 84, the arm 114 may extend from a portion of the corresponding end surface 86 or 88 defined by the base 90 and/or may extend from a portion of the corresponding end surface 86 or 88 that is defined by one or more of the heat dissipating elements 102. Although each holder 64 is shown herein as extending along an approximate entirety of the width of the heat sink 52, one or more of the holders 64 may extend along only a portion of the width of the heat sink 52. In the exemplary embodiment, the heat sink 52 includes two holders 64, with one at each of the ends 78 and 80. But, the heat sink 52 may include any number of the holders 64. Moreover, each end 78 and 80 may include any number of holders 64. In one exemplary alternative embodiment, the heat sink 52 includes one or more holders 64 located at each of the ends 78, 80, 82, and 84.

Figure 5:
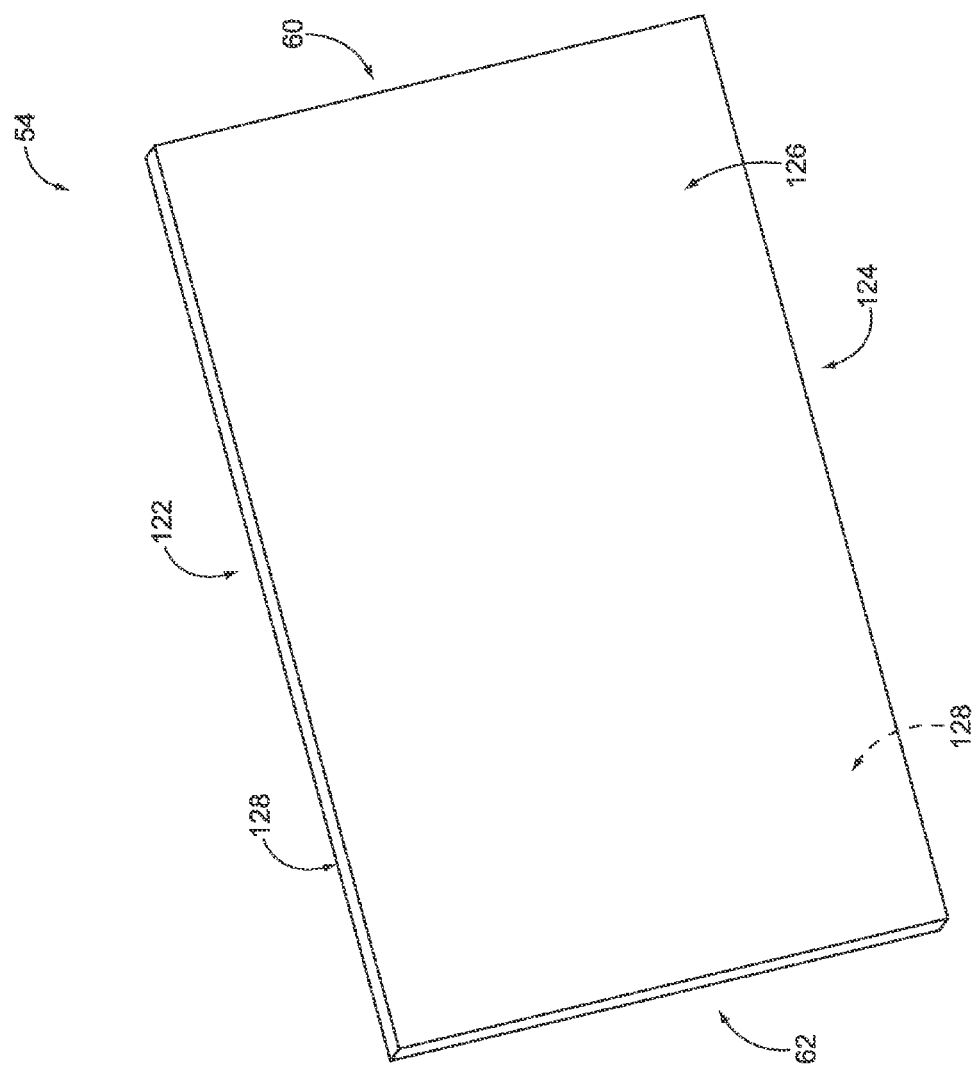
FIG. 5 is a perspective view of an exemplary embodiment of a thermal interface material (TIM) layer of the connector assembly shown in FIG. 1.

FIG. 5 is a perspective view of an exemplary embodiment of the TIM layer 54. The TIM layer 54 extends a length from the end 60 to the opposite end 62, and extends a width from an end 122 to an end 124 that is opposite the end 122. The TIM layer 54 includes a module side 126 and a heat sink side 128 that is opposite the module side 126. When the TIM layer 54 is held on the heat sink 52 (FIGS. 1, 3, 4, and 6-8), the heat sink side 128 is engaged with the module side 56 (FIGS. 1, 3, 4, and 6) of the heat sink 52. The module side 126 of the TIM layer 54 engages the upper side 58 (FIGS. 1, 2, 5, and 6) of the pluggable module 16 (FIGS. 1, 2, and 6) when the pluggable module 16 is received within the receptacle 18 (FIG. 1). The end 60 may be referred to herein as a "rear end", while the end 62 may be referred to herein as a "front end".

The TIM layer 54 may be fabricated from any type of thermal interface material. Examples of thermal interface materials that may be used to fabricate the TIM layer 54 include, but are not limited to, a paste, a grease, an oil, a silicone material, a phase change material, aluminum oxide, zinc oxide, boron nitride, micronized silver, pulverized silver, and/or the like. Although shown as having a generally rectangular shape, the TIM layer 54 may include any other shape in addition or alternative to the rectangular shape. The shape of the TIM layer 54 may be based on a shape of the receptacle 18, the heat sink 52, and/or the pluggable module 16.

Figure 6:
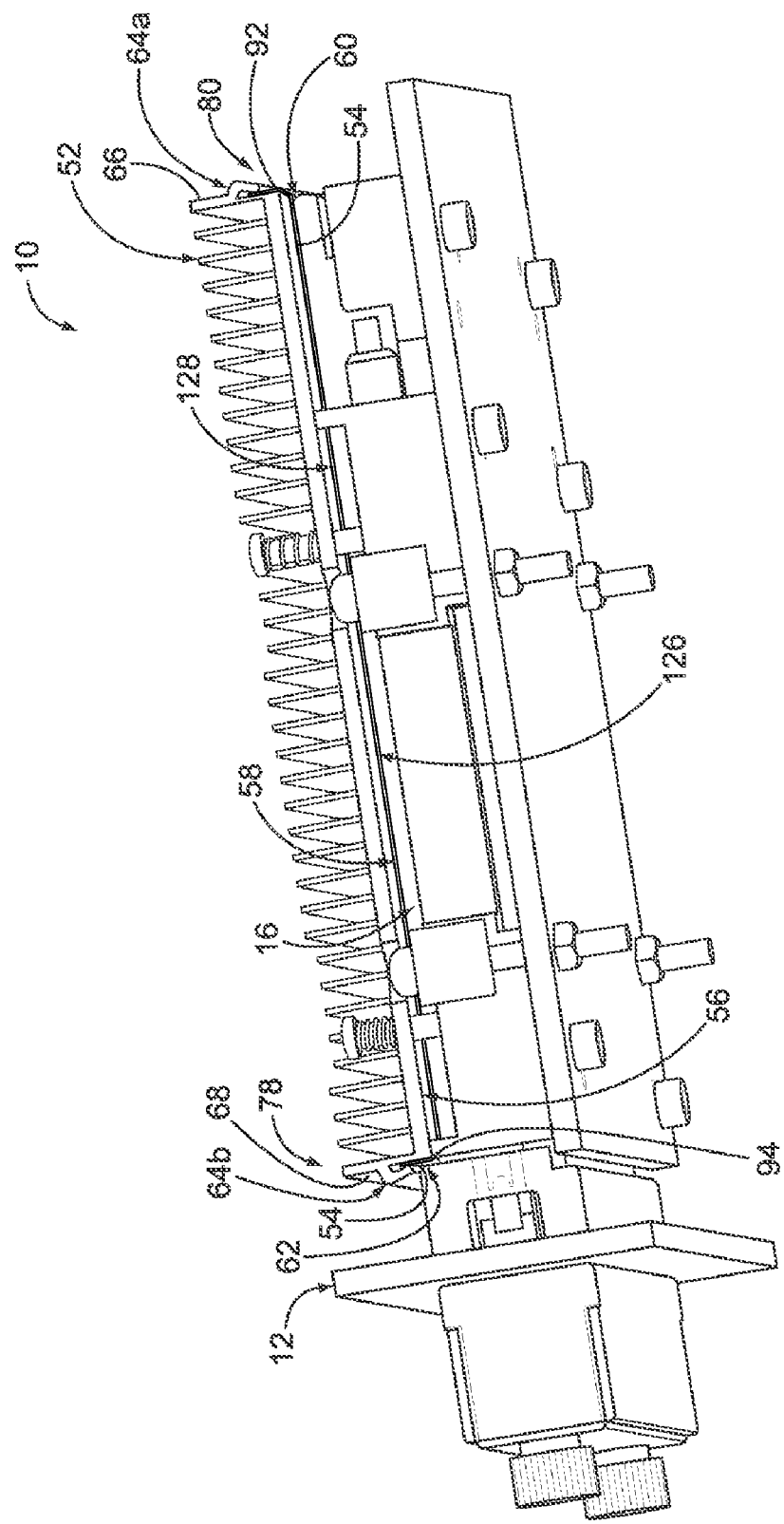
FIG. 6 is another perspective view of the connector assembly and panel shown in FIG. 1 taken from a different angle than FIG. 1.

FIG. 6 is another perspective view of the connector assembly 10 and panel 12 taken from a different angle than FIG. 1. The TIM layer 54 extends on the module side 56 of the heat sink 52. The TIM layer 54 thereby extends between the module side 56 of the heat sink 52 and the upper side 58 of the pluggable module 16 along at least a portion of the length and width of the module and upper sides 56 and 58, respectively. The heat sink side 128 of the TIM layer 54 is engaged with the module side 56 of the heat sink 52, while the module side 126 of the TIM layer 54 is engaged with the upper side 58 of the pluggable module 16.

The TIM layer 54 is engaged with the holders 64 to hold the TIM layer 54 on the module side 56 of the heat sink 52. Specifically, as can be seen in FIG. 6, the end 60 of the TIM layer 54 overlaps the edge 92 at the rear end 80 of the heat sink 52. The opposite end 62 of the TIM layer 54 overlaps the edge 94 at the front end 78 of the heat sink 52. The holder 64a is crimped toward the end surface 66 into the crimped position such that the holder 64a attaches the end 60 of the TIM layer 54 to the rear end 80 of the heat sink 52. Similarly, the holder 64b is crimped toward the end surface 68 into the crimped position such that the holder 64b attaches the end 62 of the TIM layer 54 to the front end 78 of the heat sink 52. The attachment of the ends 62 and 60 of the TIM layer 54 to the front and rear ends 78 and 80, respectively, of the heat sink 52 holds the TIM layer 54 on the module side 56 of the heat sink 52. In addition to the holders 64, an adhesive is optionally applied between the TIM layer 54 and the module side 56 of the heat sink 52 to aid in holding the TIM layer 54 on the module side 56 of the heat sink 52. The attachment of the ends 60 and 62 of the TIM layer 54 will be described in more detail below with reference to FIGS. 7 and 8, respectively.

Figure 7:
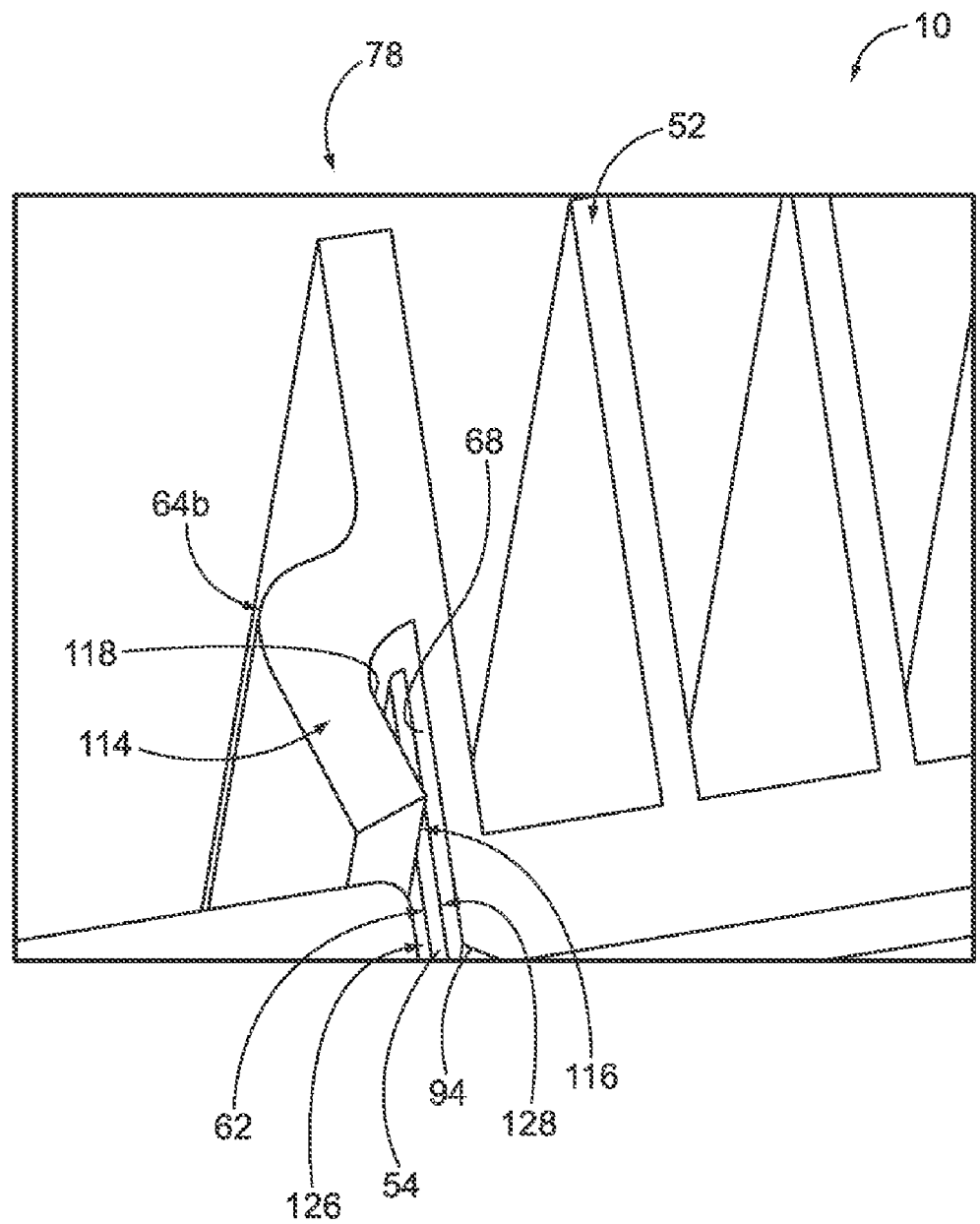
FIG. 7 is an enlarged perspective view of a portion of the connector assembly shown in FIGS. 1 and 6 illustrating attachment of the TIM layer shown in FIG. 5 to a front end of the heat sink shown in FIGS. 3 and 4.

FIG. 7 is an enlarged perspective view of a portion of the connector assembly 10 illustrating attachment of the TIM layer 54 to the front end 78 of the heat sink 52. The end 62 of the TIM layer 54 overlaps the edge 94 of the heat sink 52 and is received between the interior surface 118 of the arm 114 of the holder 64b and the end surface 68 of the heat sink 52. In the crimped position shown in FIG. 7, the tip 116 of the arm 114 of the holder 64b is engaged with the module side 126 at the end 62 of the TIM layer 54. The end surface 68 of the heat sink 52 is engaged with the heat sink side 128 at the end 62 of the TIM layer 54. The end 62 of the TIM layer 54 is thereby engaged between the arm tip 116 of the holder 64b and the end surface 68 of the heat sink 52. Engagement between the holder 64b and the end surface 68 holds the end 62 of the TIM layer 54 on the front end 78 of the heat sink 52. In other words, the end 62 of the TIM layer 54 is attached to the front end 78, including the end surface 68, of the heat sink 52. In some embodiments, the end 62 of the TIM layer 54 is only engaged with the end surface 68 of the heat sink 52 proximate where the arm tip 116 is engaged with the end 62.

FIG. 8 is an enlarged perspective view of another portion of the connector assembly 10 illustrating attachment of the TIM layer 54 to the rear end 80 of the heat sink 52. The end 60 of the TIM layer 54 overlaps the edge 92 of the heat sink 52. The end 60 is received between the interior surface 118 of the arm 114 of the holder 64a and the end surface 66 of the heat sink 52. FIG. 8 illustrates the arm 114 of the holder 64a in the crimped position, wherein the tip 116 of the arm 114 is engaged with the module side 126 at the end 60 of the TIM layer 54, and wherein the end surface 66 of the heat sink 52 is engaged with the heat sink side 128 at the end 60 of the TIM layer 54. The end 60 of the TIM layer 54 is thereby engaged between the arm tip 116 of the holder 64a and the end surface 66 of the heat sink 52. Engagement between the holder 64a and the end surface 66 attaches the end 60 of the TIM layer 54 to the rear end 80, including the end surface 66, of the heat sink 52. In some embodiments, the end 60 of the TIM layer 54 is only engaged with the end surface 66 of the heat sink 52 proximate where the arm tip 116 is engaged with the end 60.

As used herein, the term "printed circuit" is intended to mean any electric circuit in which the conducting connections have been printed or otherwise deposited in predetermined patterns on and/or within an electrically insulating substrate. The substrate 22 may be a flexible substrate or a rigid substrate. The substrate 22 may be fabricated from and/or include any material(s), such as, but not limited to, ceramic, epoxy-glass, polyimide (such as, but not limited to, Kapton® and/or the like), organic material, plastic, polymer, and/or the like. In some embodiments, the substrate 22 is a rigid substrate fabricated from epoxy-glass, which is sometimes referred to as a "circuit board". The substrate 22 may include any number of layers.

The embodiments described and/or illustrated herein may provide a connector assembly having a receptacle for receiving a pluggable module, wherein a thermal interface material (TIM) layer on a heat sink of the connector assembly may be less likely to be damaged when the pluggable module is loaded into the receptacle.

It is to be understood that the above description and the figures are intended to be illustrative, and not restrictive. For example, the above-described and/or illustrated embodiments (and/or aspects thereof) may be used in combination with each other. In addition, many modifications may be made to adapt a particular situation or material to the teachings of the subject matter described and/or illustrated herein without departing from its scope. Dimensions, types of materials, orientations of the various components (including the terms "upper", "lower", "vertical", and "lateral"), and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description and the figures. The scope of the subject matter described and/or illustrated herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A heat sink assembly for a pluggable module, said heat sink assembly comprising:
   a heat sink comprising a module side and an end surface that intersects the module side, the module side being configured to thermally communicate with the pluggable module, a holder extending from the end surface of the heat sink; and
   a thermal interface material (TIM) layer extending on the module side of the heat sink, the TIM layer being configured to engage the pluggable module, the TIM layer comprising an end that is engaged between the end surface and the holder of the heat sink.

2. The assembly according to claim 1, wherein the holder is crimped toward the end surface of the heat sink to hold the TIM layer between the holder and the end surface.

3. The assembly according to claim 1, wherein the heat sink comprises a cooling fin that defines at least a portion of the end surface, the holder extending from the cooling fin.

4. The assembly according to claim 1, wherein the holder comprises an arm that extends outwardly from the end surface of the heat sink to a tip, the end of the TIM layer being engaged between the tip of the arm and the end surface of the heat sink.

5. The assembly according to claim 1, wherein the module side intersects the end surface of the heat sink at an edge, the end of the TIM layer overlapping the edge and the end surface.

6. The assembly according to claim 1, wherein the end surface of the heat sink is a rear end surface, the holder is a rear holder, and the end of the TIM layer is a rear end, the heat sink extending from a front end surface to the rear end surface, a front holder extending from the front end surface, the TIM layer extending from a front end to the rear end, wherein the front end of the TIM layer is engaged between the front end surface and the front holder of the heat sink.

7. The assembly according to claim 1, wherein the heat sink comprises a base that includes the module side, the base comprising a heat dissipation side that is opposite the module side, a cooling fin extending outwardly from the heat dissipation side of the base, the base and the cooling fin each defining a portion of the end surface of the heat sink, the holder extending from the cooling fin.

8. The assembly according to claim 1, wherein the heat sink extends from a front end to a rear end, and extends from a side end to an opposite side end, the rear end comprising the end surface of the heat sink.

9. The assembly according to claim 1, further comprising an adhesive extending between the TIM layer and the module side of the heat sink.

10. The assembly according to claim 1, wherein the holder is integrally formed with the heat sink.

11. A receptacle assembly for a pluggable module, said receptacle assembly comprising:
   guide rails spaced apart from each other to define a receptacle extending therebetween, the receptacle being configured to receive the pluggable module therein; and
   a heat sink assembly comprising:
      a heat sink comprising a module side and an end surface that intersects the module side, the module side defining a boundary of the receptacle and being configured to thermally communicate with the pluggable module when the pluggable module is received within the receptacle, a holder extending from the end surface of the heat sink; and
      a thermal interface material (TIM) layer extending on the module side of the heat sink, the TIM layer being configured to engage the pluggable module when the pluggable module is received within the receptacle, the TIM layer comprising an end that is engaged between the end surface and the holder of the heat sink.

12. The assembly according to claim 11, wherein the holder is crimped toward the end surface of the heat sink to hold the TIM layer between the holder and the end surface.

13. The assembly according to claim 11, wherein the heat sink comprises a cooling fin that defines at least a portion of the end surface, the holder extending from the cooling fin.

14. The assembly according to claim 11, wherein the holder comprises an arm that extends outwardly from the end surface of the heat sink to a tip, the end of the TIM layer being engaged between the tip of the arm and the end surface of the heat sink.

15. The assembly according to claim 11, wherein the end surface of the heat sink is a rear end surface, the holder is a rear holder, and the end of the TIM layer is a rear end, the heat sink extending from a front end surface to the rear end surface, a front holder extending from the front end surface, the TIM layer extending from a front end to the rear end, wherein the front end of the TIM layer is engaged between the front end surface and the front holder of the heat sink.

16. The assembly according to claim 11, wherein the heat sink comprises a base that includes the module side, the base comprising a heat dissipation side that is opposite the module side, a cooling fin extending outwardly from the heat dissipation side of the base, the base and the cooling fin each defining a portion of the end surface of the heat sink, the holder extending from the cooling fin.

17. The assembly according to claim 11, wherein the heat sink extends from a front end to a rear end, and extends from a side end to an opposite side end, the rear end comprising the end surface of the heat sink.

18. The assembly according to claim 11, further comprising an adhesive extending between the TIM layer and the module side of the heat sink.

19. The assembly according to claim 11, wherein the holder is integrally formed with the heat sink.

20. A heat sink assembly for a pluggable module, said heat sink assembly comprising:
   a heat sink extending from a front end surface to a rear end surface, the heat sink comprising a module side that intersects the front end surface at front edge and intersects the rear end surface at a rear edges, the module side being configured to thermally communicate with the pluggable module; and
   a thermal interface material (TIM) layer extending on the module side of the heat sink, the TIM layer being configured to engage the pluggable module, the TIM layer extending from a front end to a rear end, the front end of the TIM layer overlapping the front edge of the heat sink and being attached to the front end surface of the heat sink, the rear end of the TIM layer overlapping the rear edge of the heat sink and being attached to the rear end surface of the heat sink.

* * * * *